(12) United States Patent
Ohrem et al.

(10) Patent No.: US 11,022,230 B2
(45) Date of Patent: Jun. 1, 2021

(54) ACTUATOR FOR CONTROLLING THE FLUID PATHS OF A FILLING UNIT FOR A BEVERAGE FILLING SYSTEM, FILLING UNIT, AND BEVERAGE FILLING SYSTEM

(71) Applicant: KHS GmbH, Dortmund (DE)

(72) Inventors: Jochen Ohrem, Bad Kreuznach (DE); Jonathan Lorenz, Bad Kreuznach (DE); Bernd Bruch, Weinsheim (DE); Ludwig Clüsserath, Bad Kreuznach (DE)

(73) Assignee: KHS GmbH, Dortmund (DE)

( * ) Notice: Subject to any disclaimer, the term of this patent is extended or adjusted under 35 U.S.C. 154(b) by 159 days.

(21) Appl. No.: 16/079,317

(22) PCT Filed: Jan. 20, 2017

(86) PCT No.: PCT/EP2017/051145
§ 371 (c)(1),
(2) Date: Aug. 23, 2018

(87) PCT Pub. No.: WO2017/148614
PCT Pub. Date: Sep. 8, 2017

(65) Prior Publication Data
US 2019/0049034 A1    Feb. 14, 2019

(30) Foreign Application Priority Data
Mar. 1, 2016    (DE) ..................... 10 2016 103 661.7

(51) Int. Cl.
*F16K 31/02*  (2006.01)
*B67C 3/28*  (2006.01)
*F16K 31/00*  (2006.01)
*F03G 7/06*  (2006.01)
(Continued)

(52) U.S. Cl.
CPC .............. *F16K 31/025* (2013.01); *B67C 3/28* (2013.01); *F03G 7/06* (2013.01); *F03G 7/065* (2013.01); *F16K 31/002* (2013.01); *F16K 31/007* (2013.01); *H01L 41/083* (2013.01); *H01L 41/12* (2013.01)

(58) Field of Classification Search
CPC .. B67C 3/28; F16F 1/361; F16K 7/045; F16K 31/06; F16K 31/0655–0665; F16K 31/0672; F16K 31/126–1266
USPC ............................................ 251/4, 7, 129.06
See application file for complete search history.

(56) References Cited

U.S. PATENT DOCUMENTS 4,657,223 A * 4/1987 Lindgren ................ B60T 11/10
251/172
4,786,028 A * 11/1988 Hammond .............. F16K 7/065
251/7

(Continued)

FOREIGN PATENT DOCUMENTS

DE        203 19 619 U1    4/2004
DE    11 2005 000 562      6/2009
(Continued)

*Primary Examiner* — Seth W. Mackay-Smith
(74) *Attorney, Agent, or Firm* — Occhiuti & Rohlicek LLP

(57) ABSTRACT

An actuator that controls flow through a fluid path during filling of beverages includes an actuator element that exerts an actuating force. In response to control signals, the actuator element transitions between an elongated state and a resting state.

15 Claims, 9 Drawing Sheets

(51) Int. Cl.
*H01L 41/12* (2006.01)
*H01L 41/083* (2006.01)

(56) References Cited

U.S. PATENT DOCUMENTS

| | | | | |
|---|---|---|---|---|
| 5,222,713 | A * | 6/1993 | Lawless | F16K 31/007 |
| | | | | 138/45 |
| 5,769,387 | A * | 6/1998 | Perez C. | F16K 7/17 |
| | | | | 251/61.4 |
| 6,026,847 | A * | 2/2000 | Reinicke | F16K 31/0624 |
| | | | | 137/487.5 |
| 2005/0199845 | A1* | 9/2005 | Jones | F16K 15/033 |
| | | | | 251/129.06 |
| 2009/0045042 | A1* | 2/2009 | Browne | F16D 69/00 |
| | | | | 204/157.15 |
| 2009/0314975 | A1* | 12/2009 | Scheibe | F16K 31/0675 |
| | | | | 251/129.15 |
| 2012/0060965 | A1* | 3/2012 | Poeschl | B67C 3/02 |
| | | | | 141/1 |
| 2012/0153199 | A1* | 6/2012 | Nguyen | H01F 7/081 |
| | | | | 251/129.15 |
| 2012/0248354 | A1* | 10/2012 | Takamatsu | B60T 8/367 |
| | | | | 251/129.02 |
| 2013/0221255 | A1* | 8/2013 | Ferguson | F16K 31/0651 |
| | | | | 251/129.15 |
| 2014/0246615 | A1* | 9/2014 | Volz | F16K 27/029 |
| | | | | 251/129.15 |
| 2015/0053181 | A1* | 2/2015 | Zhang | F02M 63/0026 |
| | | | | 123/456 |
| 2015/0128910 | A1* | 5/2015 | Zhang | F02D 41/2096 |
| | | | | 123/478 |
| 2015/0152972 | A1* | 6/2015 | D'Errico | F16K 1/36 |
| | | | | 141/311 R |
| 2015/0182133 | A1* | 7/2015 | Sano | F16K 1/36 |
| | | | | 600/498 |
| 2016/0161004 | A1* | 6/2016 | Thompson | F16K 1/02 |
| | | | | 251/8 |

FOREIGN PATENT DOCUMENTS

| | | | | |
|---|---|---|---|---|
| DE | 10 2010 032 398 | | 2/2012 | |
| DE | 102012105347 | | 12/2013 | |
| DE | 10 2013 214952 | | 2/2015 | |
| WO | WO2010054775 | | 5/2010 | |
| WO | WO-2015128136 A1 * | 9/2015 | | F02M 63/0015 |

* cited by examiner

ACTUATOR FOR CONTROLLING THE FLUID PATHS OF A FILLING UNIT FOR A BEVERAGE FILLING SYSTEM, FILLING UNIT, AND BEVERAGE FILLING SYSTEM

RELATED APPLICATIONS

This is the national stage entry of international application PCT/EP2017/051145, filed on Jan. 20, 2017, which claims the benefit of the Mar. 1, 2016 priority date of German application DE 10-2016-103-661.7, the contents of which are herein incorporated by reference.

FIELD OF INVENTION

The present invention relates to filling systems for filling containers with a beverage, and in particular, to actuators.

BACKGROUND

In a mass production system for filling containers with a beverage, a variety of steps are often carried out before actually filling the container with the beverage. For instance, it is often necessary to flood a container with an inert gas to purge oxygen, which can be harmful to beverages. Thus, a filling element used in such a system has fluid paths for the inert gas and for the beverage.

To control flow of fluids, it is usual to have valves that open and close these fluid paths. The need for valves, in turn, creates a need for actuators that open and close these valves. A common type of actuator is an electro-pneumatic actuator.

SUMMARY

An object of the present invention is to provide a more economical actuator for use in a filling system by relying on material properties that can be easily changed so as to cause a deformation of the material, which can then be used as a basis for opening and closing a flow path. The path itself can be a path for liquid or a path for gas.

In one aspect, the invention features an actuator for controlling a flow path of a filling unit for a beverage-filling system. The actuator includes control unit and an actuator element that exerts an actuating force in response to a control signal from the control unit. The actuator element comprises a material that transitions between an elongated state and a rest state in response to the control signal. In some cases, the rest state is what seals the fluid path shut. In other cases, it is the elongated state that seals the fluid path shut. These cases are referred to as the "normally-closed" and "normally-open" cases.

The actuating force in some embodiments is at least in the range of 200-400 newtons and in particular in the range of 350-370 newtons. In a preferred embodiment, the actuating force is about 360 newtons. These ranges of sizes have criticality because they have been found to provide a particularly secure closure of the fluid paths at the working pressures that prevail in a filling unit of a typical beverage filling-system.

In some embodiments, the actuator element comprises a body made of a magnetorheological elastomer. In some of these embodiments, a ring coil applies a magnetic field that activates the magnetorheological elastomer. Examples of suitable magnetorheological elastomers include composites of magnetizable particles, such as iron, in an elastomer matrix, such as silicone or natural rubber. When the magnetic field is imposed, the body deforms and thus carries out an actuating movement. Upon switching off the magnetic field, the body reverts to its original form. The transition between these two states requires only a few milliseconds and is limited primarily by how rapidly the magnetic field can be built up.

Embodiments also include those in which the actuator element comprises a magnetorheological fluid or a gel. The actuation of such a magnetorheological fluid takes place in manner similar to that used for actuating a body made of a magnetorheological elastomer.

Embodiments also include those in which the actuator element comprises an electrorheological fluid or a gel. The actuation of such a electrorheological fluid takes place in manner similar to that used for actuating a body made of a magnetorheological fluid or gel with the exception that actuation requires an electric field rather than a magnetic field. Accordingly, applying a voltage can carry out actuation.

Embodiments also include those in which the actuator element comprises a dielectric elastomer. A suitable dielectric elastomer is one that includes a soft elastomer film having an electrically-insulating base material, such as silicone, polyurethane, an acrylic elastomer, or natural rubber, together with two highly flexible, extendible, and, at the same time, conductive electrodes. In response to a voltage applied between the electrodes, the elastomer film contracts in thickness and extends its surface. Upon removal of the voltage, the elastomer film reverts to its original form. By stacking the dielectric elastomer films, the force and actuation force can be increased accordingly.

In other embodiments, the actuator element comprises a thermal shape-memory alloy. A thermal shape-memory alloy comprises metallic compounds that deform in response to a temperature increase. The deformation arises because of a transformation between a martensitic crystal structure and an austenitic crystal structure. A suitable shape-memory alloy is a nickel-titanium alloy.

Preferably, the material is conditioned before being used. With a conditioning for the two-way effect, the material deforms on cooling back into its original shape. It must be borne in mind, however, that hysteresis can occur. Due to the deformation and the transition from martensitic into an austenitic crystal structure, and vice-versa, however, it is possible to produce high actuating forces. Actuation can be ensured, for example, by a corresponding heat source.

In other embodiments, the material from which the actuator element is made comprises a magnetic shape-memory alloy. Magnetic shape-memory alloys are typically metals. A suitable alloy is a nickel-manganese-gallium alloy. Here too, the deformation can take place due a crystal transition of the magnetic shape-memory alloy, although, by contrast with the thermal shape-memory alloy, this is triggered by the imposition of a magnetic field.

Embodiments also include those in which there are multiple actuator elements of the same type that cooperate to carry out the actuator's function. For example, the multiple actuators are made of the same material. Some embodiments include those in which multiple actuator elements connect in series. Among these embodiments are those in which actuator elements take part in forming a folding bellows.

Additional embodiments include those in which multiple actuator elements are of different types, such as different materials. These can be combined to attain and adjust appropriate actuation forces and/or appropriate lifting paths.

The lifting path of an actuator is typically on the order of a few millimeters. It has been found that a lifting path of more than one millimeter, and in particular, one between five and ten millimeters offers criticality in sealing the fluid path. When the fluid path is for a liquid, it has been found that a lifting path of more than ten millimeters offers criticality for sealing of the fluid path.

In other embodiments, the actuator element comprises a piezoelectric material, such as a piezoelectric ceramic or dielectric. A piezoelectric material promotes particularly simple and reliable actuation and the ability to achieve the necessary actuation forces with ease.

Among the embodiments that rely on a piezoelectric element are those in which piezoelectric elements are arranged in a stack. The use of stacked piezoelectric elements permits the lifting path of the actuator to be easily adjusted.

Some embodiments make use of the fact that a piezoelectric element will generate an electric field in response to an applied force. This electric field results in a measurable voltage that can then be exploited to make a force sensor or a pressure sensor. As a result, a piezoelectric element of this type can be used to both control a fluid path and to sense pressure along the fluid path, thereby integrating two functions into a single structure.

In some embodiments, the actuator element transitions between first and second elongations. The first elongation defines a switch setting that actuates a diaphragm so as to cause the diaphragm to seal a fluid path. The second elongation causes the diaphragm to not seal the fluid path. This combination of an actuator and a fluid-valve diaphragm provides a simple way to control the fluid path of a filling unit.

In an additional aspect, the invention features a beverage filling-system having plural filling units, at least one of which has an actuator as described herein.

BRIEF DESCRIPTION OF THE DRAWINGS

Further details and advantages of the invention are now explained in greater detail on the basis of the exemplary embodiment represented in the drawings, in which.

DETAILED DESCRIPTION

Figure 1:
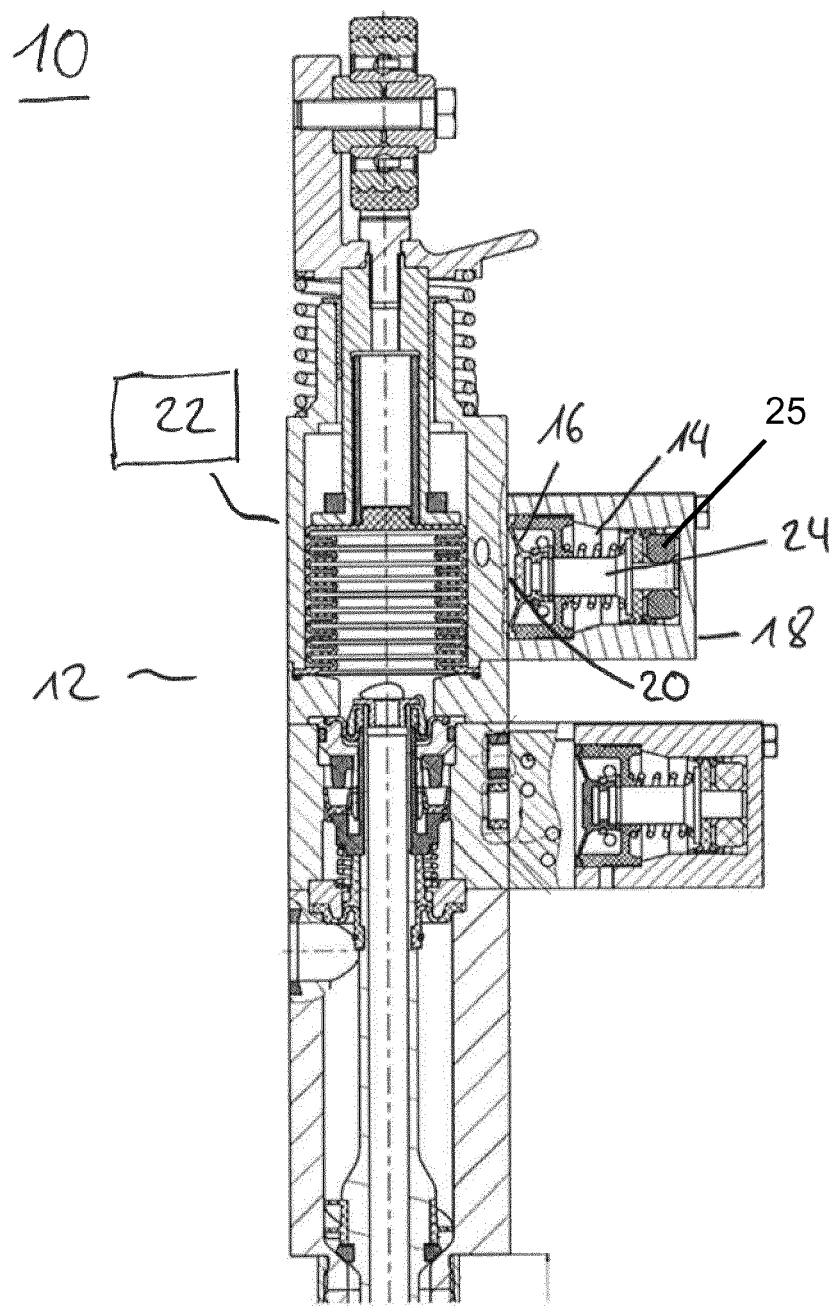
FIG. 1 shows a beverage filling-system with a filling unit and an actuator.

FIG. 1 shows a beverage filling-system 10 having a filling unit 12 with an actuator 14 that controls whether or not a fluid path 20 is open or closed. The actuator 14 is arranged together with a diaphragm 16 in a housing 18 of the filling unit 12. At a free end of the actuator 14 is a damping element 25.

The diaphragm 16 is a fluid-valve diaphragm having a membrane that has a lifting path of approximately six millimeters or more, and in some cases, more than ten millimeters. The fluid path 20 has an extent of about twenty-four millimeters.

The actuator 14 includes an actuator element 24 that responds to a control signal from a control unit 22. This control signal causes the actuator 14 to transition between first and second switching positions. In the first switching-position, the actuator 14 releases the diaphragm 16. In the second switching-position, the actuator 14 actuates the diaphragm 16 so that the diaphragm 16 seals the fluid path 20.

The actuator element 24 assumes first and second elongations in response to first and second control signals from the control unit 22. The first elongation causes the actuator element 24 to assume a resting position. The second elongation causes the actuator element 24 to assume an activation position. In some embodiments, the transition time required to transition in either direction is on the order of forty milliseconds.

In some embodiments, an actuating force associated with these transitions is within the range of two-hundred newtons to four-hundred newtons. Among these are embodiments in which it is between three-hundred fifty and three-hundred seventy newtons. A preferred value is approximately three-hundred sixty newtons.

In some embodiments, working pressures can lie in the range between three to ten bar, in particular eight bar, or, with the adjustment of the diaphragm surface area of the diaphragm 16, about six bar.

The actuator element 24 transitions between first and second switching positions that cause the diaphragm 16 to transition between first and second states. In the first state, the diaphragm seals the fluid path 20. This is the diaphragm's "closed position." In the second state, the diaphragm 16 leaves the fluid path 20 open. This is the diaphragm's open position.

One of the first and second states is a default state. This is the state of the diaphragm 16 when the actuator 14 has not been actuated. In some embodiments, the diaphragm 16 is in the second state when the actuator 14 is not actuated. This is a "normally open" configuration. In other embodiments, the diaphragm 16 is in its second state when the actuator 14 is not actuated. This is the "normally closed" configuration.

In an alternative embodiment, which is similar to that shown in FIG. 1, the actuator element 24 has a stable shape. In this embodiment, an end actuator replaces the damping element 25.

FIGS. 2a-d shows a first embodiment of an actuator assembly 114 as shown in FIG. 1 surrounded by a bellows 124. The illustrated actuator assembly 114 relies on the electrical response of a dielectric elastomer.

A control unit 22 causes a current source 116 to apply a current by connecting a voltage source that maintains a voltage U. This actuates the actuator assembly 114, which then causes the diaphragm 16 to enter a conical-cylindrical expansion chamber 122 of the fluid path 21, thus sealing the fluid path 21.

As is apparent from the figures, the actuator assembly 114 comprises actuators 114' connected in series to increase the extent to which the actuator assembly 114 can change its overall length.

Figures 2A, 2B:
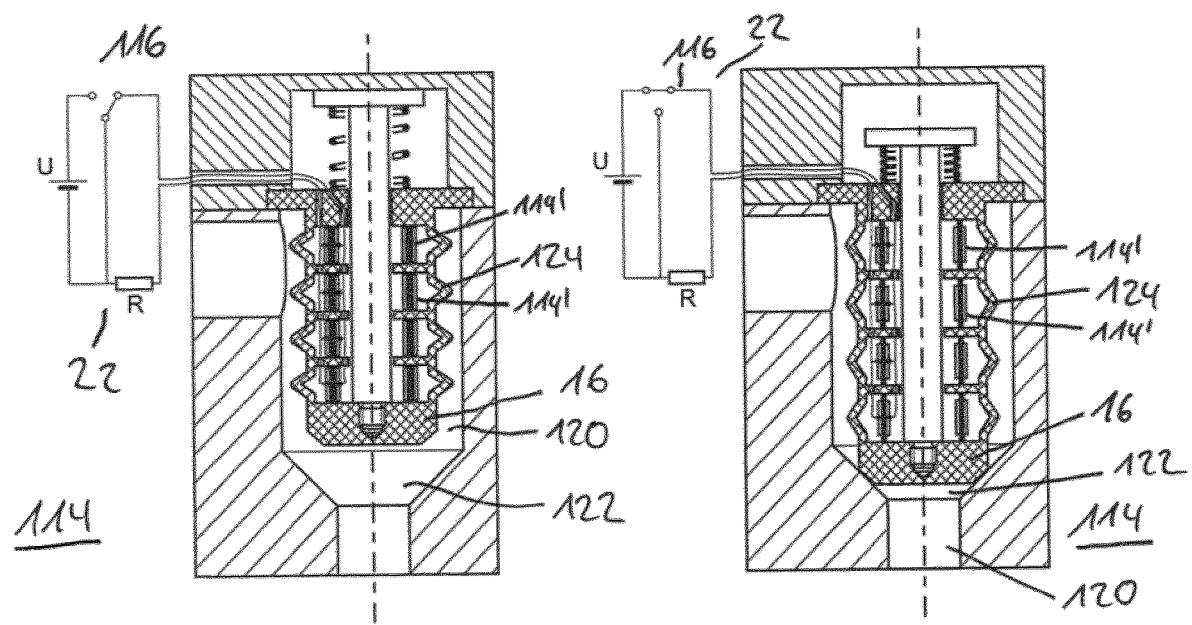
FIGS. 2a-d show an actuator that relies on a dielectric elastomer.
Figure 2C:
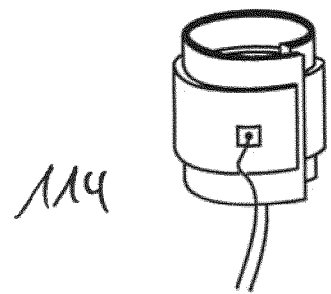
Figure 2D:
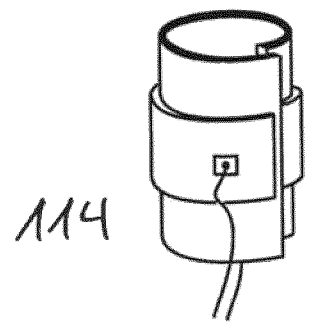

FIG. 2c shows a first actuator 114 that has contracted as a result of having been de-energized and short-circuited. FIG. 2d shows the first actuator 114 after it has elongated as a result of having been subjected to an electrical stimulus. In the example shown, the first actuator 114 would cause a normally-open configuration. However, it is possible to reconfigure the actuator 114 so that the result is a normally-closed configuration.

Figure 3A:
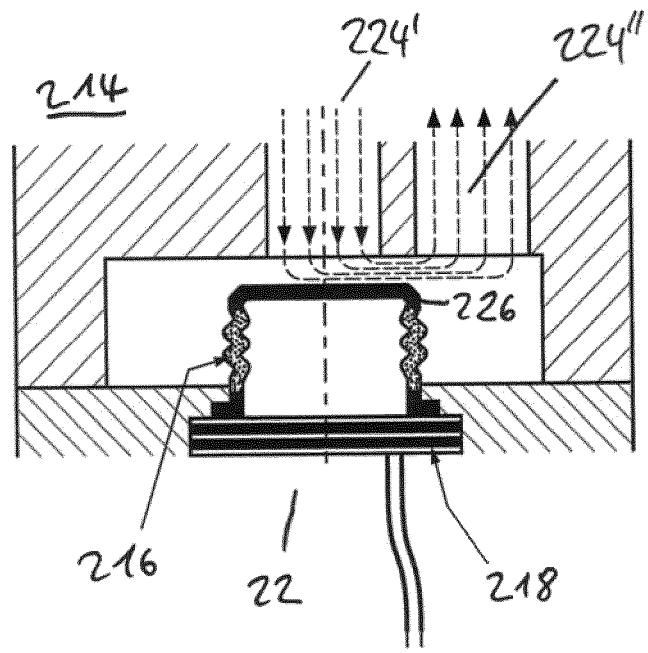
FIGS. 3a-b show an actuator that relies on a magneto-rheological elastomer.
Figure 3B:
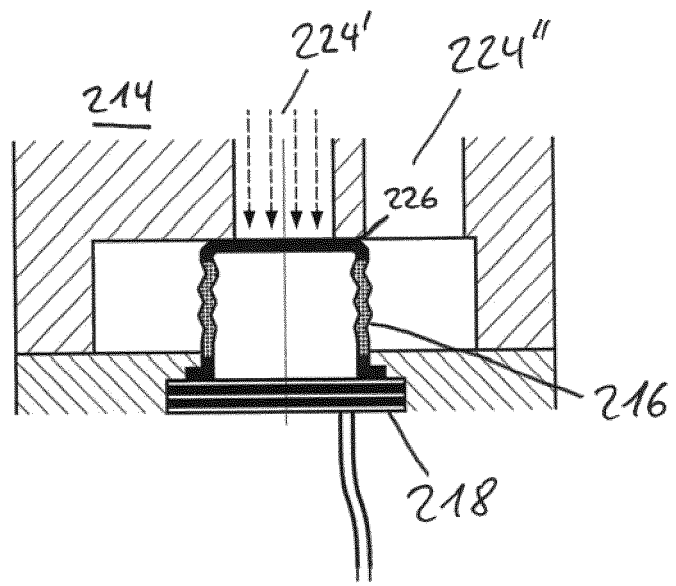

FIGS. 3a and 3b show a second actuator 214 in which a magnetorheologic elastomer surrounds the actuator 214. The magnetorheologic elastomer 216 comprises a soft elastomer matrix into which magnetic particles have been introduced.

An electromagnet 218 activates the magnetorheologic elastomer 216 in response to a control signal from the control unit 22. The second actuator 214 can be implemented so that it is normally closed or normally open. The particular embodiment shown in FIGS. 3*a* and 3*b* is one that is normally open.

FIG. 3*a* shows the second actuator 214 in a state in which it has contracted. In this state, the electromagnet 218 is turned off. At the molecular level, the molecules are not polarized and not aligned. They are chaotically distributed. As a result, the actuator 214 is essentially folded together.

In the state shown in FIG. 3*a*, the electromagnet 218 has been switched off. This means that the shape of the magnetorheologic elastomer 216 depends on external forces exerted upon it. In the illustrated embodiment, these forces include forces exerted by the bellows as it returns to its default shape, forces resulting from, forces arising from a flow through first and second fluid paths 224', 224" or any combinations thereof. In some embodiments, as shown in FIG. 1, a return spring contributes to these external forces.

In the state shown in FIG. 3*b*, the electromagnet 218 has been turned on, thus polarizing and aligning the molecular constituents that comprise the magnetorheological elastomer 216. This expands the magnetorheological elastomer 216 and causes it to assume a shape in which the diaphragm 16 presses against an outflow opening of the first fluid path 224', thus sealing it shut. This force is great enough to overcome a resetting force, such as that exerted by a return spring.

Figure 4A:
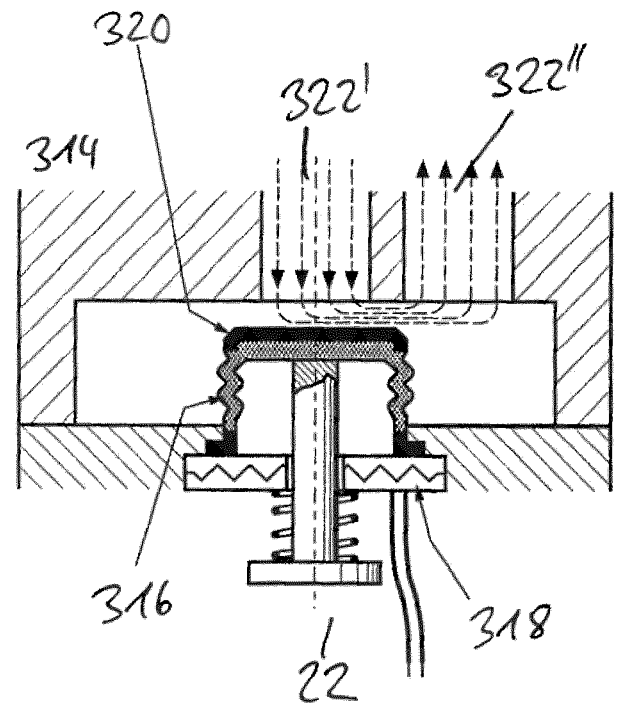
FIGS. 4a-b show an actuator that relies on shape-memory alloys.
Figure 4B:
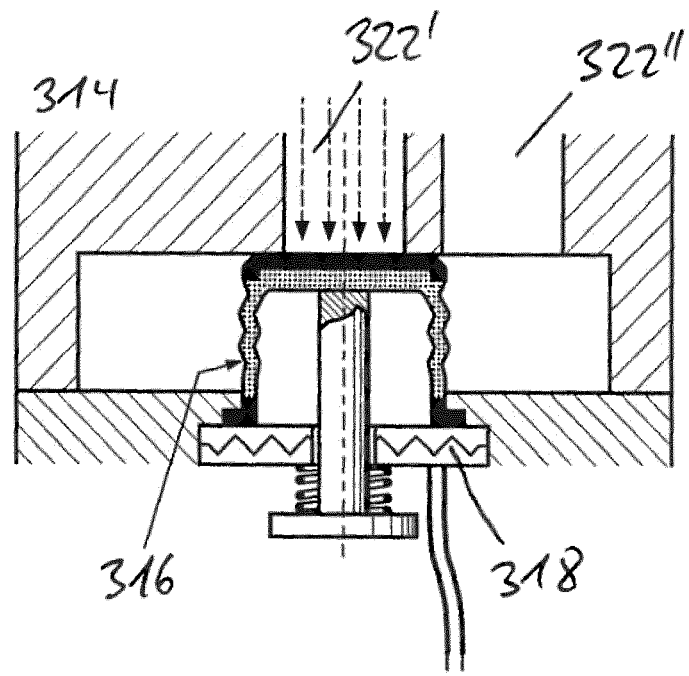

FIGS. 4*a* and 4*b* show a further embodiment of an actuator 314 that can be used in the filling unit 12 shown in FIG. 1. As shown in the figures, the filling element includes an inlet 322 and an outlet 322". A diaphragm 320 coupled to the alloy 316 seals the fluid inlet 322 as shown in FIG. 4*b*.

In this embodiment, the actuator 314 comprises a shape-memory alloy 316 that changes shape in response to a stimulus. In the embodiment described below, the stimulus is heating or cooling. However, a shape-memory alloy that responds to a magnetic stimulus can also be used.

The embodiment shown in FIGS. 4*a* and 4*b* includes a heater 318 that turns on and off in response to instructions from the control unit 22. In this embodiment, the heat from this heater 318 is the stimulus that causes the shape-memory alloy to change shape. The change in shape causes the actuator 314 to transition between the two states shown in FIGS. 4*a* and 4*b*.

The actuator 314 can be configured so that it assumes the state shown in FIG. 4*a* when the heater 318 is turned off, in which case the actuator is normally open. Or the actuator 314 can be configured to assume the state shown in FIG. 4*b* when the heater 318 is turned off, in which case the actuator 314 is normally closed.

In some embodiments, a return spring that engages from inside or outside resets the actuator 314. Such a return spring is particularly important when the material responds to a stimulus in only one direction. For example, there are materials that will change state when a stimulus is applied but will not change back to their original state when the stimulus is removed.

In other embodiments, the shape-memory alloy is one that changes shape upon exposure to a magnetic field. In that case, it is a magnet rather than a heater that supplies appropriate stimulus.

In some embodiments, the shape-memory alloy is plastically deformable.

In some embodiments, the shape-memory alloy is a magnetic displaced metal grid. In such cases, heating the alloy 316 produces an austenitic aligned metal grid that changes the shape of the shape-memory alloy. This change in shape moves the diaphragm 320, thus causing it to open or close the fluid path.

Figure 5A:
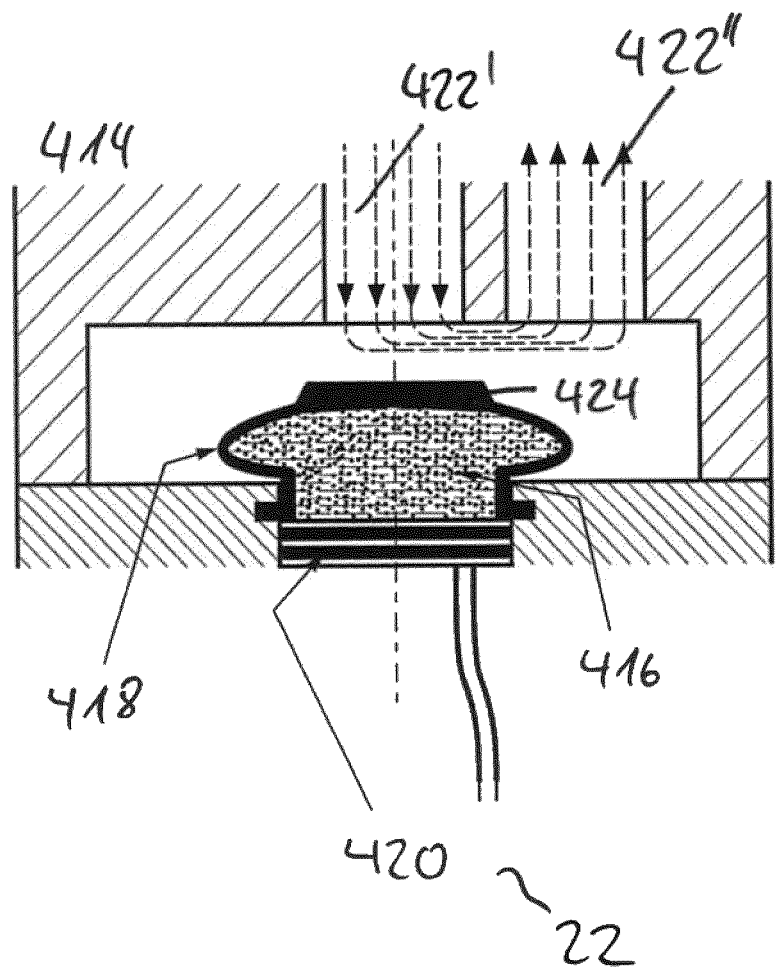
FIGS. 5a-b show an actuator that relies on magnetorheological fluids in a casing.
Figure 5B:
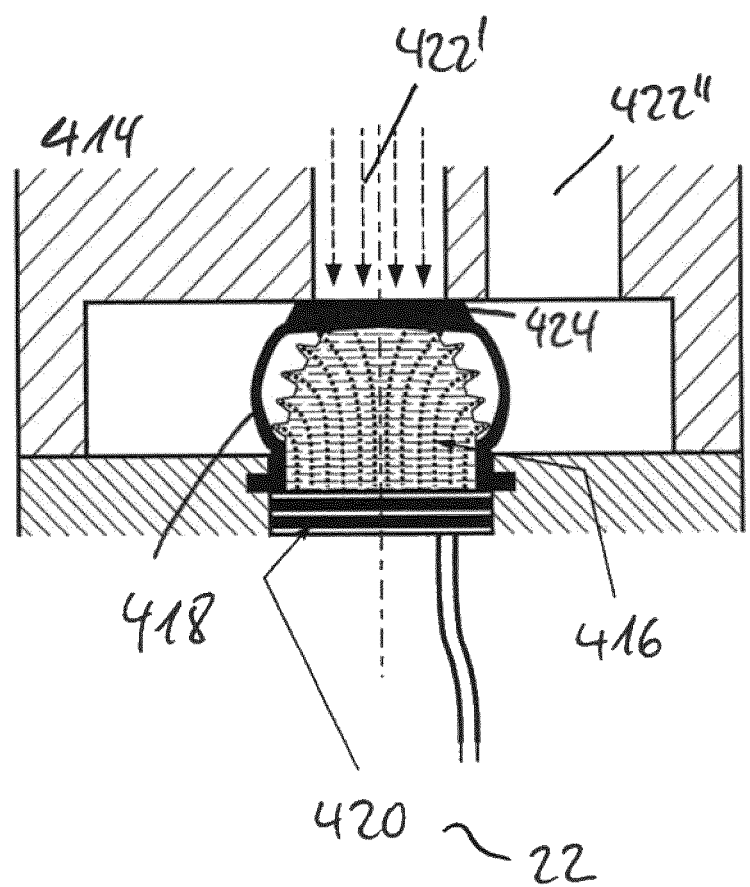

In yet another embodiment, shown in FIGS. 5*a* and 5*b*, an actuator 414 includes an elastic casing 418 that accommodates a magnetorheological fluid 416. As was the case with the other actuators already described, the actuator 414 can be configured so that it is open in the absence of stimulus or closed in the absence of stimulus. The former is referred to as being "normally open" and the latter is referred to as being "normally closed." The actuator 414 that is shown in FIGS. 5*a* and 5*b* is one that is normally open.

The control unit 22 actuates the actuator 414 using an electromagnet 420. As was the case with other embodiments, the filling unit 12 has a fluid path 20 that has an inlet 422' and an outlet 422".

As shown in FIG. 5*b*, causing current to flow through the electromagnet 420 creates a magnetic field that expands the magnetorheological fluid 416, thus causing the elastic casing 418 to elongate. This causes a diaphragm 424 arranged on the elastic casing 418 to press against the opening of the inlet 422', thus sealing it shut.

FIG. 5*a* shows the constituent magnetic particles in the magnetorheological fluid 416 in a chaotic arrangement. When the electromagnet 420 turns on, the resulting magnetic field aligns these particles as shown FIG. 5. This leads to expansion and movement of the actuator 414 toward the inlet 422'. The magnetorheologic fluid can be a liquid or a gel.

Figure 6A:
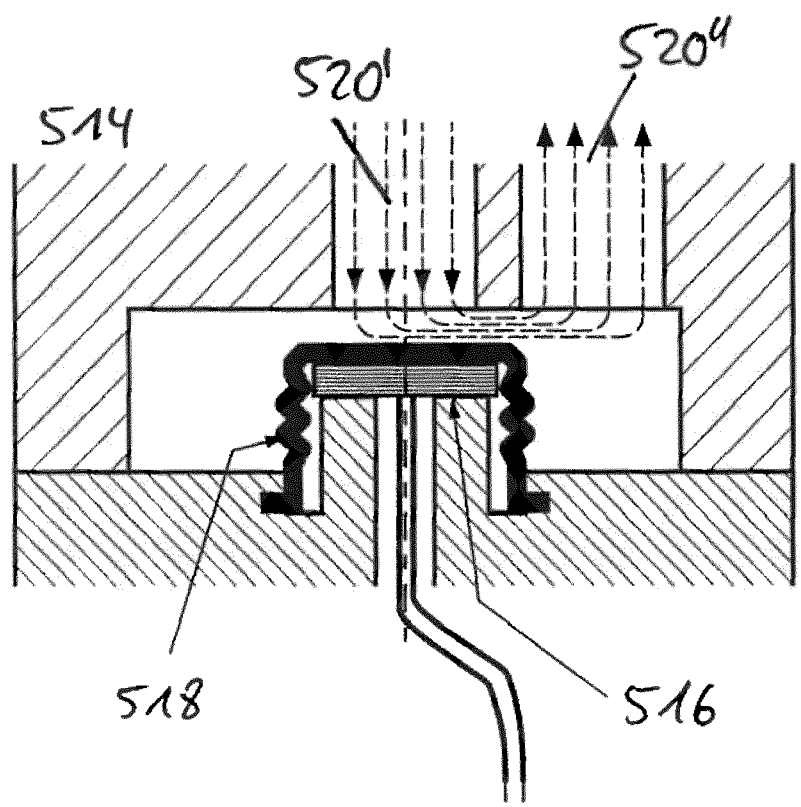
FIGS. 6a-b show an actuator that relies on piezoelectric ceramics.
Figure 6B:
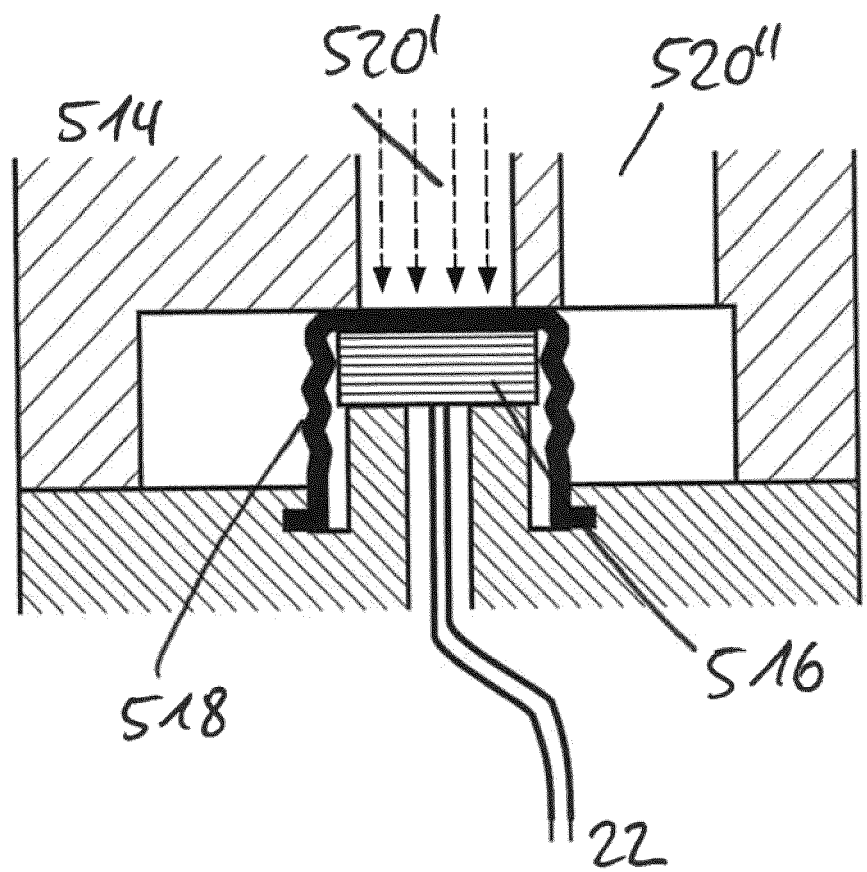

FIGS. 6*a* and 6*b* show yet another actuator 514 having a stack of piezoelectric element 516 and a soft sealing elastomer 518 that functions as a diaphragm. In this embodiment, the control unit 22 causes imposition of an electric field that changes the shape of the piezoelectric element 516.

As was the case with other embodiments, the filling unit 12 has a fluid path 20 that has an inlet 520' and an outlet 522".

As was the case with the other actuators already described, the actuator 514 can be configured so that it is open in the absence of stimulus or closed in the absence of stimulus. The former is referred to as being "normally open" and the latter is referred to as being "normally closed." The actuator 514 that is shown in FIGS. 6*a* and 6*b* is one that is normally open.

In the state without current imposed, as shown in FIG. 6*a*, the piezoelectric element 516 remains in a relaxed state in which they are not elongated. As a result, the sealing elastomer 518 is not positioned against the inlet 520'.

In the state in which current is imposed, the piezoelectric ceramics transition into their elongated states. This presses the soft sealing elastomer 518, against the opening of the inlet 520', thus sealing it closed. The switching is carried out, for example, by an inverse piezoelectric effect.

In addition to changing shape in response to an applied electric field, a piezoelectric element also has the property of generating an electric field in response to an applied force that deforms it. This enables the piezoelectric element to also function as a pressure sensor. Therefore, after having closed the inlet 520' with a set value of force, a change in the force applied to the piezoelectric ceramic will generate its own electric field and hence a voltage. This provides a way to measure pressure in the connected chamber. In this way, the piezoelectric element 516 serves as an actuator as well as a sensor.

Having described the invention and a preferred embodiment thereof, what is claimed as new and secured by Letters Patent is:

1. An apparatus comprising an actuator that controls flow through a fluid path during filling of beverages, said actuator comprising a folding bellows, a control unit, and an actuator element that exerts an actuating force, wherein the control unit causes first and second control signals, wherein said actuator element transitions between an elongated state and a resting state in response to said control signals, and wherein said actuator element is one of a plurality of actuator elements that are connected in series to form at least part of said folding bellows.

2. The apparatus of claim 1, wherein said actuator element is a first actuator element, wherein said actuator comprises a second actuator element, and wherein said first and second actuator elements are connected in series, whereby connecting said first and second actuator elements in series increases an extent to which said actuator changes an overall length of said actuator.

3. The apparatus of claim 1, wherein said actuator element comprises an elastomer.

4. The apparatus of claim 1, wherein said actuator element comprises a dielectric elastomer.

5. The apparatus of claim 1, wherein said actuator element comprises a piezoelectric pressure sensor, whereby said actuator element is able to both control a fluid path and to sense pressure along the fluid path, thereby integrating two functions into a single structure.

6. An apparatus comprising an actuator and a filling unit, wherein said actuator controls flow through a fluid path of said filling unit during filling of a container with beverage, wherein said actuator comprises an actuator element that exerts an actuating force and a control unit that causes first and second control signals, wherein said actuator element transitions between an elongated state and a resting state in response to said control signals, wherein said actuator element comprises a magnetorheological elastomer, wherein said actuator element is fixed to a housing and comprises an end that faces fluid path, and wherein in said resting state, said magnetorheological elastomer's shape depends at least in part on forces arising from flow of said beverage through said fluid path.

7. The apparatus of claim 6, further comprising a beverage filling-system, wherein said filling unit is a constituent of said beverage-filling system.

8. The apparatus of claim 6, wherein the actuator element exerts an actuation force that is between 350 and 370 newtons.

9. The apparatus of claim 6, further comprising a diaphragm that transitions between sealing said fluid path through which beverage flows and opening said fluid path as said actuator element, to which said diaphragm is coupled, transitions between an elongated state and a resting state.

10. The apparatus of claim 6, wherein said actuator element exerts said actuation force as a result of causing deformation of a material from which a body of said actuator is made.

11. The apparatus of claim 6, further comprising a membrane arranged with said actuator element such that said actuator element causes said membrane to move along a lifting path.

12. The apparatus of claim 6, wherein the actuator is maintained in a given shape before and after actuation.

13. The apparatus of claim 6, wherein said magnetorheological elastomer is fixed to said housing.

14. The apparatus of claim 6, further comprising an electromagnet that activates said magnetorheologic elastomer in response to said control signal from said control unit.

15. The apparatus of claim 6, wherein said actuator element that exerts said actuating force is said magnetorheological elastomer and wherein said magnetorheological elastomer exerts said actuating force as a result of a transition between said elongated state and said resting state.

* * * * *